United States Patent [19]

Ozawa et al.

[11] Patent Number: 4,904,336
[45] Date of Patent: Feb. 27, 1990

[54] METHOD OF MANUFACTURING A SINGLE CRYSTAL OF COMPOUND SEMICONDUCTOR AND APPARATUS FOR THE SAME

[75] Inventors: Shoichi Ozawa, Yokohama; Katsumi Wagatsuma, Tokyo; Toshio Kikuta, Yokohama, all of Japan

[73] Assignee: The Furukawa Electric Co., Ltd., Tokyo, Japan

[21] Appl. No.: 185,476

[22] Filed: Apr. 25, 1988

[30] Foreign Application Priority Data

Apr. 28, 1987 [JP] Japan ................... 62-103115
Apr. 28, 1987 [JP] Japan ................... 62-103116
May 6, 1987 [JP] Japan ................... 62-108993

[51] Int. Cl.$^4$ ............................................. C30B 21/02
[52] U.S. Cl. ........................... 156/601; 156/602; 156/616.41; 156/DIG. 83; 422/109; 422/248
[58] Field of Search .................. 422/248, 109; 156/DIG. 83, 616.41, 601, 602

[56] References Cited

U.S. PATENT DOCUMENTS

| | | | |
|---|---|---|---|
| 2,890,940 | 6/1959 | Pfann | 156/602 |
| 4,404,172 | 9/1983 | Gault | 422/248 |
| 4,521,272 | 6/1985 | Gault | 156/DIG. 73 |
| 4,592,895 | 6/1986 | Matsutani et al. | 156/601 |

OTHER PUBLICATIONS

*Journal of Crystal Growth* 74 (1986) 491–506, North Holland, Amsterdam, "A Novel Application of the Vertical Gradient Freeze Method to the Growth of High Quality III–V Crystals"; Gault et al.
*Journal of Crystal Growth* 83 (1987) 174–183, North Holland, Amsterdam, "Vertical Gradient Freeze Growth of Large Diameter, Low Defect Density Indium Phosphide"; Monberg et al.

*Primary Examiner*—Melvyn J. Andrews
*Attorney, Agent, or Firm*—Frishauf, Holtz, Goodman & Woodward

[57] ABSTRACT

An apparatus for manufacturing a single crystal of compound semiconductor consisting of Ga and As comprises a crucible storing Ga and having a seed crystal arranged at a lower end portion thereof a gas material susceptor, arranged below the crucible, for storing As, the gas material susceptor and the crucible being arranged in a growth susceptor to be capable of communicating with each other, a main heater for heating and melting Ga in the crucible and for cooling the melt Ga from a lower portion thereof to grow a single crystal, a sub heater for heating and evaporating As in the gas material susceptor and allowing the evaporated As to react with the melt Ga in the said crucible, and a magnetic field applying coil for applying a vertical magnetic field in the melt Ga and As in the crucible so that a surface of the melt in the crucible which is grown to a single crystal is lower in temperature at a central portion thereof than a peripheral portion thereof in a radial direction and at the same time projects upward.

17 Claims, 8 Drawing Sheets

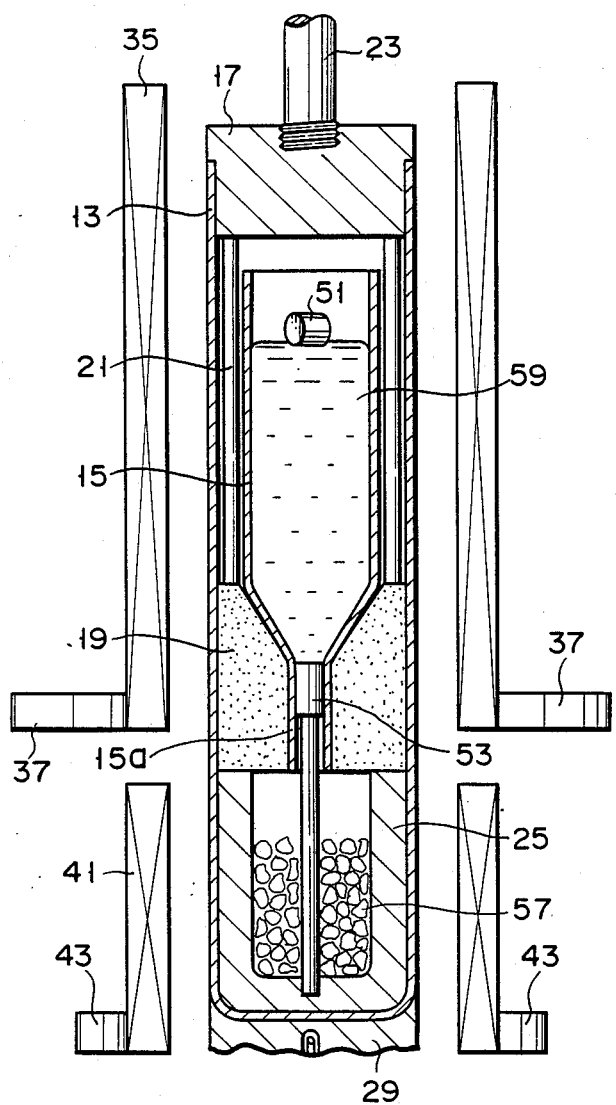
F I G. 2

METHOD OF MANUFACTURING A SINGLE CRYSTAL OF COMPOUND SEMICONDUCTOR AND APPARATUS FOR THE SAME

BACKGROUND OF THE INVENTION

1. Field of the Invention

The present invention relates to a method of manufacturing a single crystal of compound semiconductor in accordance with vertical solidification and an apparatus for the same.

2. Description of the Related Art

Conventional methods of manufacturing a single crystal of compound semiconductor in accordance with vertical solidification employ a gradual cooling technique with a vertical temperature gradient (Journal of Crystal Growth 74 (1986) 491–506). In this method, a compound semiconductor polycrystal synthesized in advance is used as a raw material and placed in a crucible and melted. The obtained melt is caused to contact with a seed crystal arranged in the bottom of the crucible, thereby performing seeding. The crucible is gradually cooled from its lower to upper portion to grow a single crystal of compound semiconductor.

In this method, a Group V element is arranged in the lower low-temperature portion of the growth susceptor housing the crucible in order to prevent scattering of the Group V element by dissociation during melting and seeding of the raw material. The Group V element is heated such that its vapor pressure is higher than its dissociation pressure. As a result, fluctuation in the melt composition is also prevented. The vertical temperature gradient required for crystal growth is obtained by a combination of a heater and a heat-insulating material. When the power supplied to the heater is gradually decreased as the crystal grows, the crucible is cooled from its lower portion.

In order to grow a high-quality single crystal having a small number of crystal defects, not only the vertical temperature distribution but also horizontal (radial) temperature distribution must be considered. More specifically, assuming a certain horizontal plane of the crucible, when the temperature distribution is such that the compound semiconductor melt is solidified from the peripheral wall to the center of the crucible (when the temperature of the central portion of the crucible is higher than its remaining portion), a polycrystal tends to be formed. Therefore, it is preferable that the temperature distribution in the radial direction of the crucible is uniform or the temperature is low at the central portion and is higher toward the peripheral portion.

However, in the conventional method, the crucible is heated only from outside with a heater. Together with the influence of the melt convection, it is difficult to control the temperature distribution in the radial direction to be substantially uniform or the temperature to be low at the central portion.

SUMMARY OF THE INVENTION

It is an object of the present invention to provide a method of manufacturing a single crystal of compound semiconductor wherein a central portion of a single crystal growth surface of a melt as a raw material in a crucible is at a lower temperature than the peripheral portion in the radial or horizontal direction and projects upward, thereby growing a high-quality single crystal; and to provide an apparatus for the same.

In an aspect of the present invention, an apparatus for manufacturing a single crystal of compound semiconductor consisting of at least two elements, comprises:

a growth susceptor;

a crucible storing a first material containing at least one type of element and having a seed crystal arranged at a lower end portion thereof;

a gas material susceptor, arranged below the crucible, for storing a material containing one type of element, the gas material susceptor and the crucible being arranged in the growth susceptor to be capable of communicating with each other;

main heating means for heating and melting the material in the crucible and for cooling the melt material from a lower portion thereof to grow a single crystal;

sub heating means for heating and evaporating the material in the gas material susceptor and allowing the evaporated material to react with the melt material in said crucible; and magnetic field applying means for applying a vertical magnetic field in the melt material in the crucible so that a surface of the melt material in the crucible which is grown to a single crystal is lower in temperature at a central portion thereof than a peripheral portion thereof in a radial direction and at the same time projects upward, the main heating means having control means for gradually decreasing the temperature of the heat applied to the melt material upward from a seed crystal, thereby growing a single crystal of compound semiconductor from the seed crystal.

In the other aspect of the present invention, a method of manufacturing a single crystal of compound semiconductor consisting of at least two elements, comprises the steps of:

storing a first material including at least one type of element in a crucible provided in a growth susceptor and arranging a seed crystal at a lower end portion of the crucible;

storing a material including one type of element in a gas material susceptor arranged under the crucible;

heating the material in the crucible, thereby melting the material;

evaporating, by heating, the material in the gas material susceptor, thereby causing the material in the gas material susceptor to react with the melt material in the crucible;

applying a vertical magnetic field to the melt material in the crucible such that a central portion of the melt material in the crucible is lower in temperature than a periphery thereof in the radial direction and that the material projects upward; and gradually decreasing the temperature of heat applied to the melt material upward, from the seed crystal, thereby growing a single crystal of compound semiconductor from the seed crystal.

BRIEF DESCRIPTION OF THE DRAWINGS

FIGS. 1, 2, and 3 show a single crystal manufacturing apparatus according to a first embodiment of the present invention in which FIG. 1 is a sectional view of an overall structure of the apparatus wherein the melt in its crucible has just been melted, FIG. 2 is a partial sectional view of the apparatus wherein its liquid stop plug is removed and single crystal growth is started, and FIG. 3 shows the temperature and shape of the growing surface of the single crystal;

DETAILED DESCRIPTION OF THE PREFERRED EMBODIMENTS

The preferred embodiments of the present invention will be described in detail with reference to the accompanying drawings.

Figure 1:
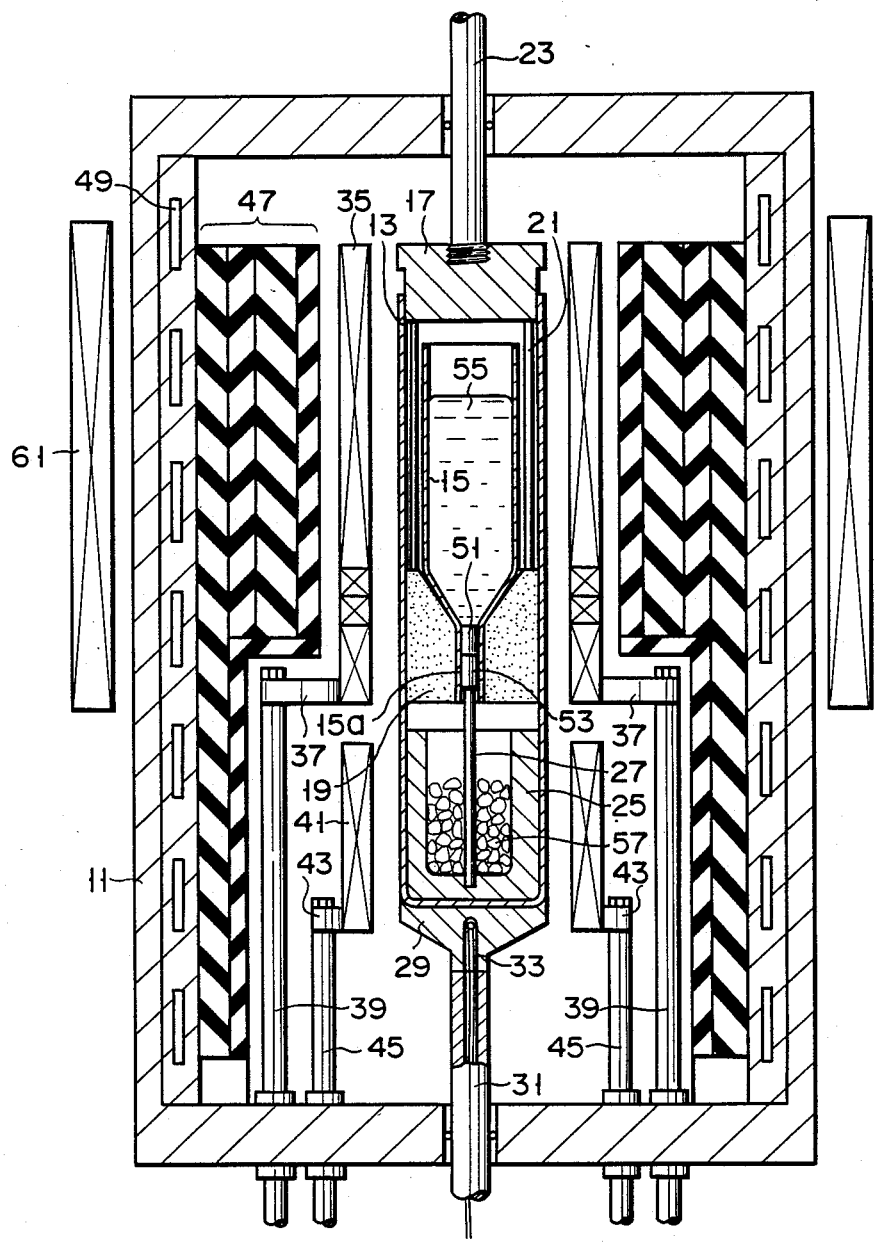

FIGS. 1 and 2 show an embodiment of the present invention. Referring to FIGS. 1 and 2, reference numeral 11 denotes a pressure chamber; 13, a cylindrical growth susceptor; and 15, a cylindrical crucible. Susceptor 13 is vertically arranged at the central portion of chamber 11 and has an open upper end. Crucible 15 is coaxially arranged in susceptor 13 to define a tubular space with it. Crucible 15 is made of PBN or quartz. The lower end portion of crucible 15 forms thin tubular portion 15a through a funnel portion. The lower end of tubular portion 15a is open.

Hermetic lid 17 is fitted in the upper end opening of growth susceptor 13. Lid 17 is vertically slidable relative to susceptor 13 while it substantially seals it. Crucible support 19 is fitted in an intermediate portion of susceptor 13. Support 19 supports crucible 15 and is vertically movable together with it. Rod-like suspending members 21 suspends support 19 to lid 17. A plurality of suspending members 21 are provided in the tubular space defined between susceptor 13 and crucible 15 to surround crucible 15 to be distant from each other in the circumferential direction. Support 19 is made of a heat-insulating material. The heat-insulating material must be porous or have holes extending in the vertical direction for ventilation. Lid 17 is supported by upper shaft 23 extending through the top plate of pressure chamber 11 to be vertically movable and rotatable.

Lower susceptor or gas material susceptor 25 for storing an element of Group V is provided at the bottom of growth susceptor 13. Push-up rod 27 is vertically fixed at the central portion of susceptor 25. The diameter of rod 27 is set such that the upper end of rod 27 may be inserted in tubular portion 15a of crucible 15. Support supports susceptor 13 with its lower surface. Support 29 is supported by lower shaft 31 extending through the bottom plate of pressure chamber 11 to be vertically movable and rotatable. Temperature-measuring thermocouple 33 is arranged in susceptor 29. The lead wires of thermocouple 33 are guided to the outside through lower shaft 31.

Main heater 35 is arranged in pressure chamber 11 to surround crucible 15 through growth susceptor 13. Main heater 35 has terminals 37, and power supply conductors 39 are connected to terminals 37 and extend to the outside. Sub heater 41 is arranged in pressure chamber 11 to surround lower susceptor 25 through susceptor 13. Sub heater 41 has terminals 43, and power supply conductors 45 are connected to terminals 43 and extend to the outside. Heat-insulating material 47 consisting of a plurality of layers of carbon or the like is provided on the inner surface of chamber 11. Cooling pipe 49 is arranged in the wall of chamber 11. Cooling water flows in pipe 49.

Heaters 35 and 41 are, e.g., graphite heaters. It is preferable that main heater 35 is divided into a plurality of portions in the vertical direction and that the respective divided portions can independently control the heating temperature.

Cylindrical coil 61 is arranged outside and coaxial with pressure chamber 11 to surround it. During crystal growth, coil 61 applies a vertical magnetic field to crucible 15. In order to effectively operate the vertical magnetic field, chamber 11 can be made of stainless steel and the respective portions of main heater 35 can be double spiral non-induction type coils.

A single crystal of compound semiconductor is manufactured using the above apparatus in the following manner. Liquid stop plug 51 and seed crystal 53 are inserted in tubular portion 15a at the lower portion of crucible 15 such that plug 51 is located on seed crystal 53. Group III element (Ga if a GaAs single crystal of compound semiconductor is to be obtained) 55 is charged in crucible 15. Plug 51 is made of a material having a specific weight smaller than that of the melt in crucible 15. Group V element (As if a GaAs single crystal of compound semiconductor is to be obtained) 57 is charged in lower susceptor 25.

Upper shaft 23 is moved upward to pull lid 17 out of growth susceptor 13, and the interior of pressure chamber 11 is evacuated, thereby removing oxygen remaining in crucible 15 and chamber 11. Subsequently, an inert gas (argon or nitrogen) is charged in chamber 11 at a pressure of 3 to 100 kg/cm$^2$. Shaft 23 is then moved downward for a predetermined distance so that lid 17 is fitted in susceptor 13 and that the upper end of push-up rod 27 is abutted against the lower end of seed crystal 53, as shown in FIG. 1.

Main heater 35 is heated to melt Group III element 55. In case of GaAs synthesis, element 55 is kept at about 1,238° C. Sub heater 41 is also heated to heat Group V element 57 to about 617° C. and to set the vapor pressure of element 57 in growth susceptor 13 at 1 atm or more. As a result, the vapor of Group V element 57 is elevated through crucible support 19. Compound semiconductor synthesis is allowed to progress in this state.

When the compound semiconductor synthesis is completed, a GaAs melt is formed in crucible 15 to gradually move upper shaft 23 downward. Then, crucible 15 is moved downward through suspending member 21 and crucible support 19, and push-up rod 27 relatively pushes up seed crystal 53 and liquid stop plug 51. Therefore, plug 51 is removed from tubular portion 15a and released into the compound semiconductor melt. Before that, coil 61 is energized to apply a vertical magnetic field of 3,000 Gauss to the melt. Since plug 51 has a specific weight smaller than that of compound semiconductor melt 59, it floats on the surface of melt 59, as shown in FIG. 2. As a result, melt 59 and seed crystal 53 are brought into direct contact with each other. The temperature distribution in this case is as follows. The contact portion between crystal 53 and melt 59 is kept at the melting point of the compound semiconductor. The temperature is gradually increased toward the upper portion.

Subsequently, for the purpose of seeding, the temperature of the contact portion is increased by about 0° to 10° C. to partially melt seed crystal 53 again to mix with melt 59. Then, main heater 35 is controlled such that the temperature is gradually decreased toward the upper portion of the melt, in the same manner as in the conventional vertical solidification, thereby growing a single crystal. During crystal growth, susceptor 13 is preferably rotated together with crucible 15 so that the symmetry of the temperature distribution is improved. The cooling rate is controlled within a range of 3° to 20° C./hr. The temperature gradient in the growing direction is as follows. It is 20° to 150° C./cm at the contact portion between seed crystal 53 and melt 59. It is 20° to 100° C./cm at the shoulder portion and is 2° to 40° C./cm at the body portion.

Figure 3:
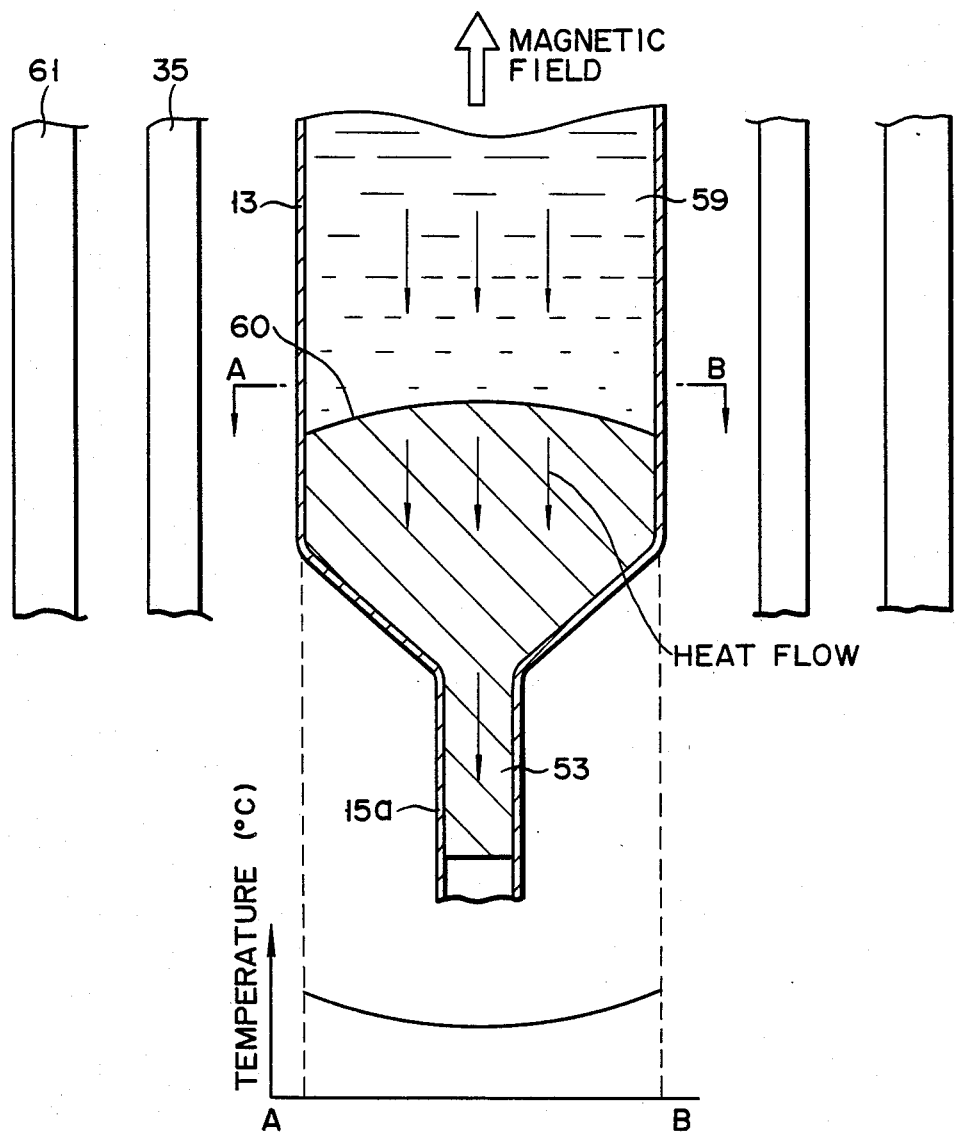

When the vertical magnetic field is applied to the melt during growth, as in the above embodiment, the flow of the melt in the direction intersecting with the magnetic field, i.e., in the radial direction is suppressed by the Lorentz force and the melt flows only in the vertical direction. As a result, heat transfer is limited to thermal conduction in the radial direction while heat transfer due to convection is present in the vertical direction. Therefore, heat transfer toward the lower low-temperature portion tends to occur easily and heat is dissipated from the lower end. Assuming a sectional view taken along the line A—B of FIG. 3, the resultant temperature distribution in the radial direction is as follows. Namely, the temperature is high at the outer surface of susceptor 13 close to heater 35 and is reduced toward the central portion. As a result, solid-liquid interface 60 slightly projects with respect to melt 59. When the melt is crystallized from the peripheral portion, single crystal of compound semiconductor 62 having a few crystal defects can be grown while thermal strain is suppressed. Since the thermal oscillation is also suppressed, generation of growth streaks due to temperature fluctuation can be suppressed.

With the above embodiment, operations starting from synthesis of the compound semiconductor melt to single crystal growth can be performed in a single crucible.

Figure 4:
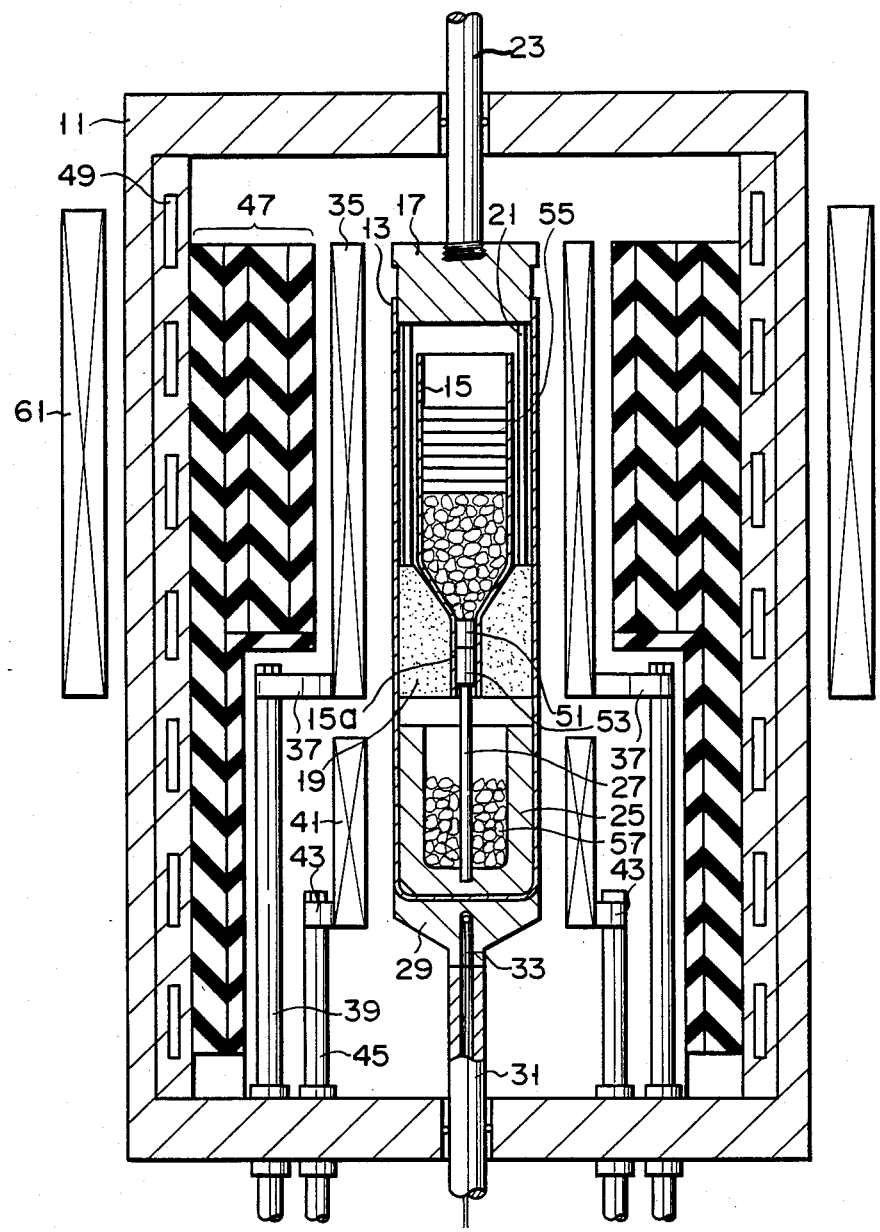
FIG. 4 is a sectional view of an apparatus according to a second embodiment of the present invention.

FIG. 4 shows another embodiment of the present invention. Referring to FIG. 4, the same reference as in FIG. 1 denote the same portions. According to this embodiment, Group III element 55 and group V element 57 are charged in crucible 15. A polycrystalline material of a compound semiconductor is synthesized in crucible 15 by direct synthesis and thereafter a compound semiconductor melt is formed.

Group III element 55 and group V element 57 are charged in crucible 15, as shown in FIG. 4, and the interior of crucible 15 is evacuated, in the same manner as in the above embodiment, to remove the oxygen remaining in it. Thereafter, the interior of crucible 15 is substituted by an inert gas and pressurized to about 100 atm.

First, shifts 23 and 31 are simultaneously moved downward to move growth susceptor 13 downward while lid 17 is fitted with susceptor 13, such that crucible 15 is located under main heater 35. Heater 35 is energized in this state. When a GaAs single crystal of compound semiconductor is to be obtained, the space inside heater 35 is maintained at a predetermined temperature falling within a range of 817° to 1,238° C. Growth susceptor 13 is moved upward to rapidly insert crucible 15 in main heater 35. As a result, Group III element 55 and Group V element 57 in crucible 15 react and synthesis directly progresses. In this case, in order to suppress evaporation of a non-reacted Group V element, group V element 57 contained in lower susceptor 25 is heated by sub heater 41 (to 617° C. or more when a GaAs single crystal of compound semiconductor to be obtained) to maintain the vapor pressure of Group V element 57. Direct synthesis is rapidly performed. As a result, a compound semiconductor polycrystal is produced in crucible 15. Then, in order to melt this polycrystalline material, the temperature is increased to a melting point+about 10° C., thereby forming a compound semiconductor melt. Subsequently, coil 61 is energized to apply a vertical magnetic field of 3,000 Gauss to the melt. In this state, crucible 15 is moved downward relative to susceptor 13 to push out liquid stop plug 51 into the melt, thereby performing seeding. Steps after that are the same as in the embodiment described above and a detailed description thereof is omitted.

Figure 5:
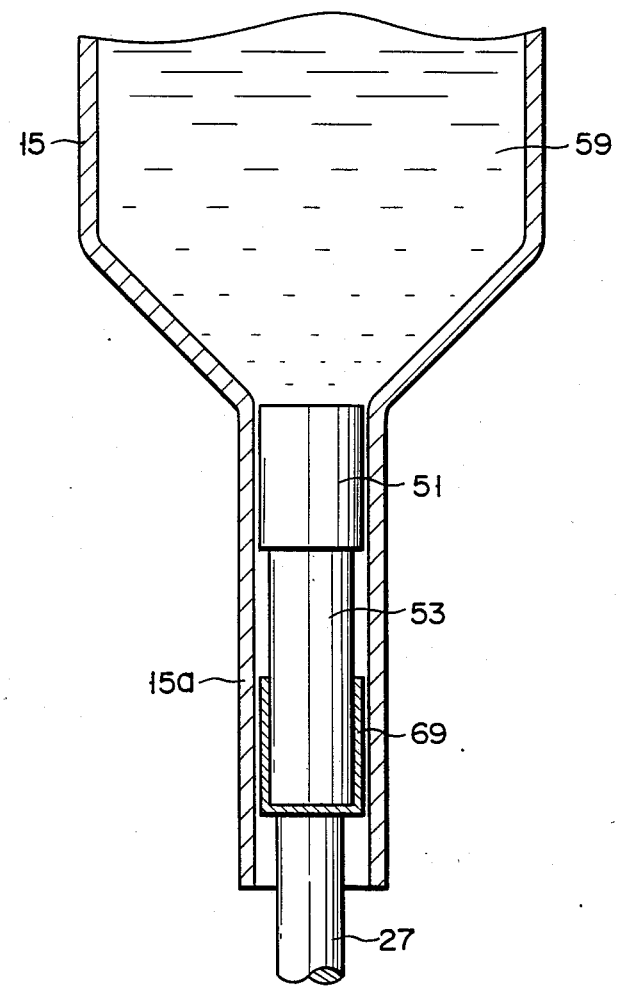
FIG. 5 is a sectional view of a case wherein a protection case is provided for the seed crystal.

In this embodiment, crystal 53 may be stored in protection case 69 and inserted in tubular portion 15a, as shown in FIG. 5, so that it is not damaged by push-up rod 27 when it is pushed up with rod 27.

In this embodiment, during crystal growth, the temperature of the melt must be gradually decreased upward from its seed crystal portion. For this purpose, a means for partially controlling the temperature of main heater 35, e.g., a divided heater as in the above embodiment, a means for vertically moving the crucible relative to the main heater, and means for vertically moving the main heater relative to the crucible, can be adopted.

Figure 6:
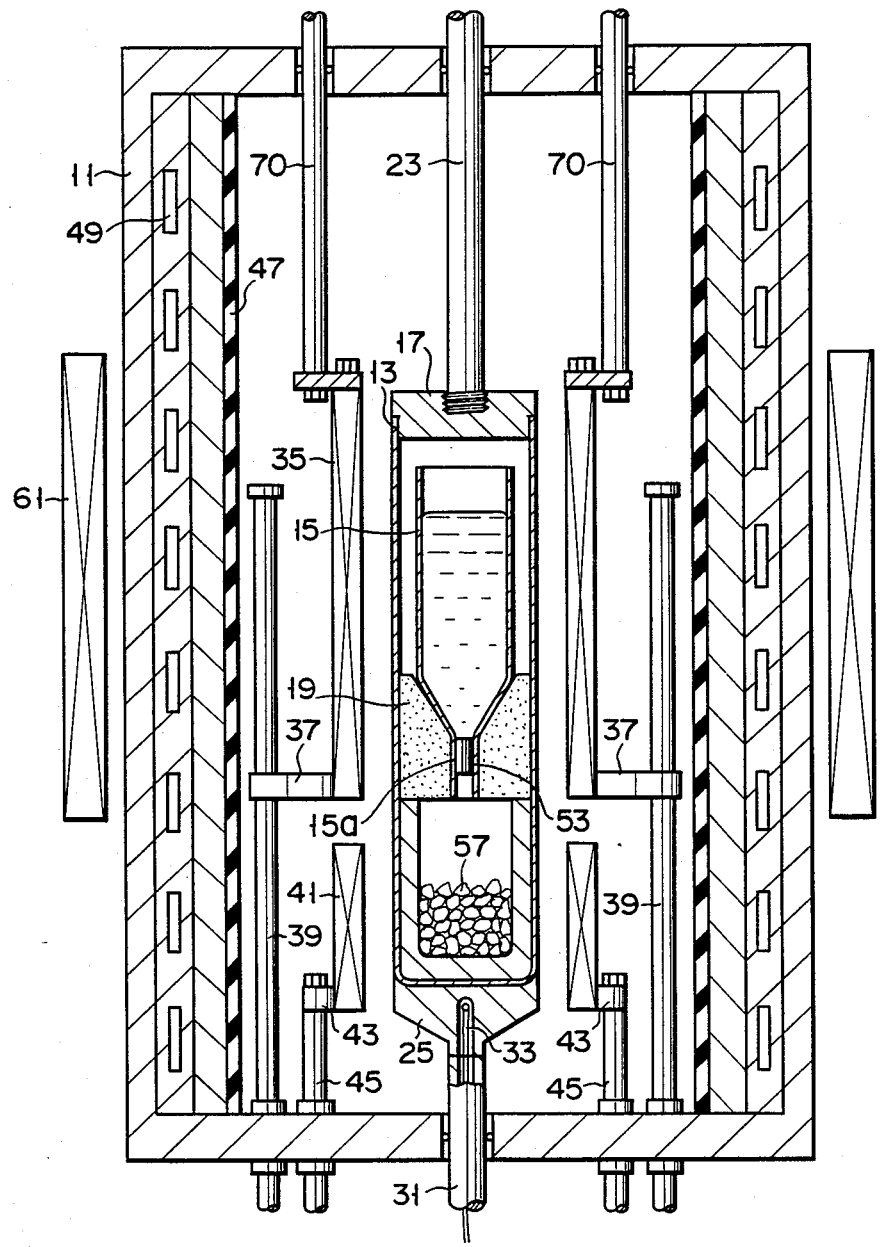
FIG. 6 is a sectional view of an apparatus according to a third embodiment of the present invention.
Figure 7:
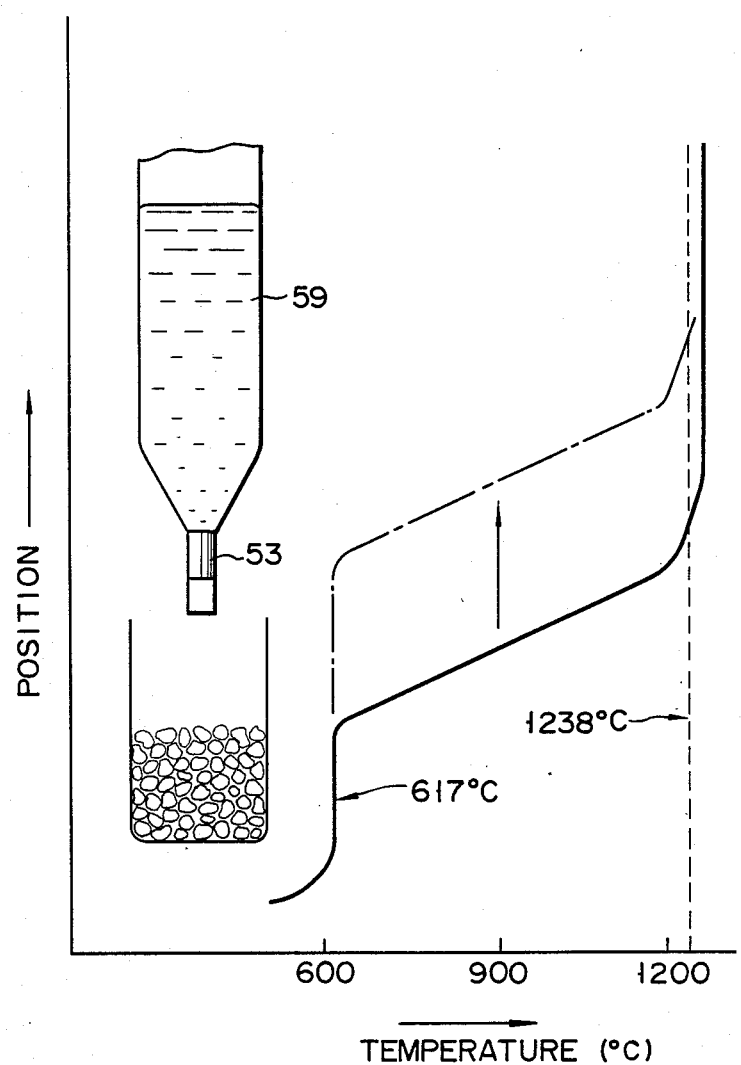
FIG. 7 is a graph showing a relationship between a melt as the raw material and the temperature distribution.

An example using these means will be described with reference to FIGS. 6 and 7. In this embodiment, the same portions as in the embodiments described above are denoted by the same reference numerals and a detailed description thereof is omitted.

In the apparatus of this embodiment, no suspending member 21 is provided between crucible support 19 and hermetic lid 17. Therefore, support 19 is fixed to growth susceptor 13.

Main heater 35 is not divided and is, e.g., a tubular graphite heater. Heater 35 is mounted on the lower end of heater support shaft 70 extending through the top plate of pressure chamber 11. When support shaft 70 is vertically moved by a drive mechanism (not shown) relative to chamber 11, heater 35 can be vertically moved together with shaft 70. Terminal 37 is in slide-contact with power supply conductor 39 in order to reliably supply power even when heater 35 is vertically moved.

A method of manufacturing a single crystal of compound semiconductor using this apparatus will be described. First, seed crystal 53 is inserted in tubular portion 15a at the lower portion of crucible 15 and set at a predetermined position. A compound semiconductor polycrystalline material is charged in crucible 15. Group V element (As when a GaAs single crystal of compound semiconductor is to be obtained) is charged in lower susceptor 25. In order to remove oxygen remaining in crucible 15 and pressure chamber 11, upper shaft 23 is moved upward to remove lid 17 from growth susceptor 13, and the interior of chamber 11 is evacuated. Thereafter, an inert gas is charged in chamber 11 and pressurized to several to 100 atm. Subsequently, shaft 23 is moved downward to fit lid 17 with susceptor 13.

Main heater 35 is energized to melt the polycrystalline material, thereby forming a compound semiconductor melt. In this case, in order to prevent the Group V element from being dissociated and scattered from the polycrystalline material surface and the melt surface, Group V element 57 in lower susceptor 52 is heated by sub heater 37, thereby adjusting the vapor pressure of Group V element 57 in susceptor 13.

After the melt is obtained, the temperature at the contact portion between seed crystal 53 and the melt is increased to be slightly higher than the melting point of the target single crystal of compound semiconductor to partially melt and mix seed crystal 53 with melt, thereby performing seeding. The temperature distribution before the start of single crystal growth is as shown in FIG. 7. The temperature at the contact portion between seed crystal 53 and melt 59 must be set at the melting point (1,238° C. when a GaAs single of compound semiconductor is the target). The heating temperature of Group V element 57 is 617° C. or more and the vapor pressure thereof is maintained at 1 atm or more in the case of GaAs.

Then, coil 61 is energized, and simultaneously heater support shaft 70 is gradually moved upward to grow the single crystal from the seeded portion to the upper portion. In this case, the growth susceptor is preferably rotated to provide a temperature distribution with a good symmetry. The heating rate must fall within a range of 0.3 to 9 mm/hr. The heating rate is set low when the solid-liquid interface is located in a range from the seeded portion to the shoulder and is kept constant when the solid-liquid interface is located at the straight body portion. The temperature distribution of main heater 35 is set and maintained to have a temperature gradient of 20° to 150° C./cm in the direction of the growth axis at the seeded portion and 0° to 20° C. at the straight body portion. Since sub heater 41 is not moved, Group V element 57 is heated at a predetermined temperature even while main heater 35 is moved upward and crystal growth is performed. Therefore, the vapor pressure of the Group V element in growth susceptor 13 is maintained constant.

In this embodiment, a vertical magnetic field of 3,000 Gauss is formed in crucible 15 by coil 61. This magnetic field is preferably 500 to 5,000 Gauss and more preferably 1,000 to 3,000 Gauss. If the magnetic field is weaker than this range, a sufficient effect cannot be expected; if stronger, the energizing means such as the coil becomes undesirably large.

Figure 8:
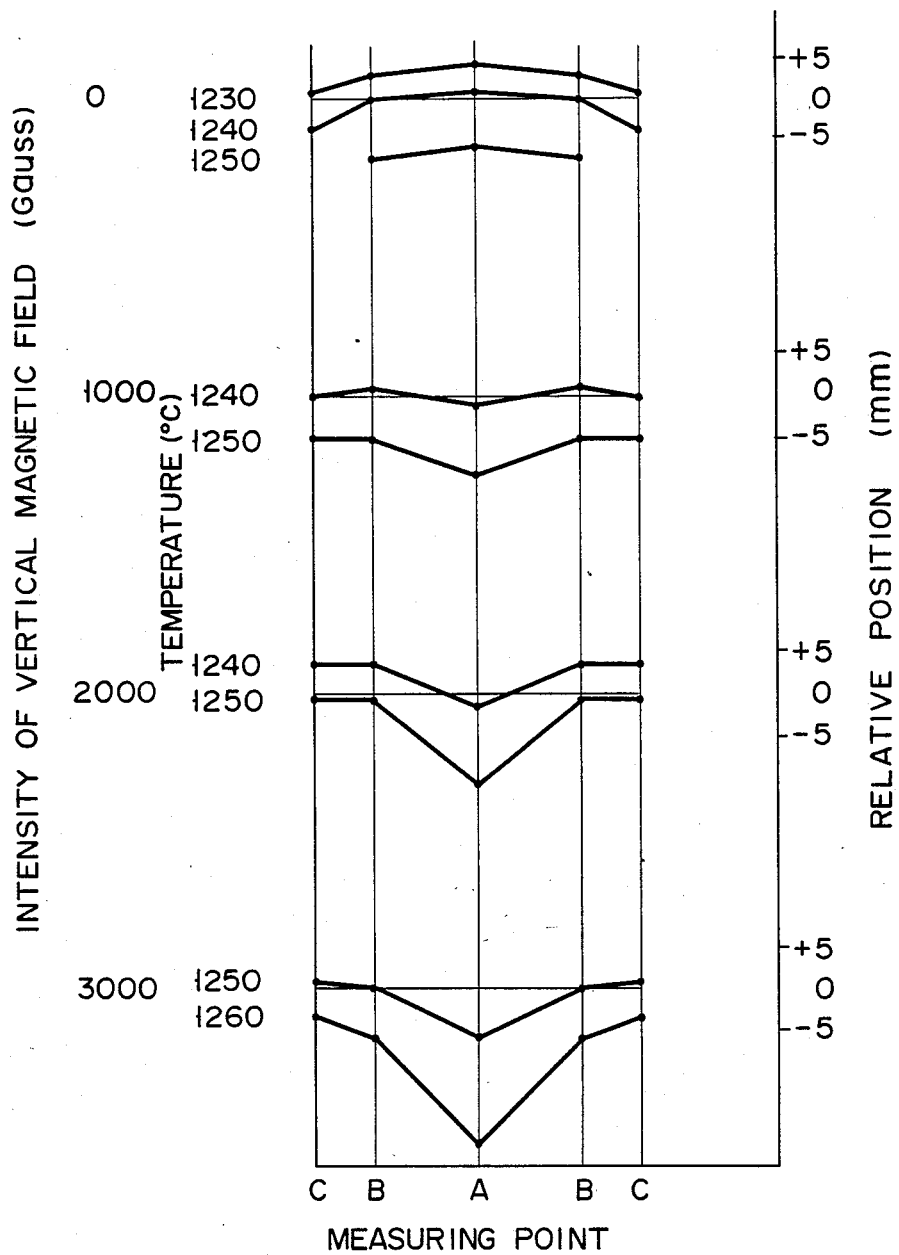
FIG. 8 is a graph of the temperature distribution in the vicinity of the solidify interface in melt when a vertical magnetic field is applied to the melt material by coil.

FIG. 8 shows the equithermal distribution of the melt material when a magnetic field is not applied to the melt material in the crucible having a diameter of 3 inches, made of PBN and when vertical magnetic fields of 1,000, 2,000, and 3,000 Gauss, respectively, are applied to the melt material in the crucible during crystal growth. Referring to FIG. 8, the measurement point is plotted along the axis of abscissa, and the intensity of the magnetic field and the vertical distance in melt of the melt material are plotted along the axis of ordinate. Regarding the axis of abscissa, reference symbol A denotes a central portion of the crucible in the radial direction; and B and C, portions distant from the central portion by 1 and 1.5 inches, respectively.

Regarding the distance in melt, 0 indicates the supposed solidify interface; +5, a portion above the interface by 5 mm; and −5, a portion below the interface by 5 mm.

Referring to FIG. 8, it is understood that when no vertical magnetic field is applied, the central portion of the melt in the crucible is higher in temperature than its periphery. However, when a magnetic field of 1,000 Gauss or more is applied, the central portion of the melt in the crucible becomes reliably lower in temperature than its periphery.

What is claimed is:

1. An apparatus for manufacturing a single crystal of compound semiconductor comprising at least two elements, the apparatus comprising:
   a growth susceptor;
   a crucible for receiving and storing a first material containing at least one type of element and having a seed crystal arranged at a lower end portion thereof;
   a gas material susceptor, arranged below said crucible, for receiving and storing a material containing one type of element, said gas material susceptor and said crucible being arranged in said growth susceptor so as to be capable of communicating with each other;
   main heating means for heating and melting material in said crucible and for cooling the melt material from a lower portion thereof to grow a single crystal;
   sub heating means for heating and evaporating material in said gas material susceptor and for allowing the evaporated material to react with the melt material in said crucible; and
   magnetic field applying means for applying a vertical magnetic field in the melt material in said crucible so that a surface of the melt material in said crucible which is grown to a single crystal is lower in temperature at a central portion thereof than at a peripheral portion thereof in a radial direction and at the same time projects upward;
   said main heating means including control means for gradually decreasing the temperature of the heat applied to the melt material upward from a seed crystal, thereby growing a single crystal of compound semiconductor from the seed crystal.

2. An apparatus according to claim 1, wherein said crucible has an upper end open in said growth susceptor and a lower end with a small-diameter tubular portion, the seed crystal being inserted in said tubular portion.

3. An apparatus according to claim 2, which further comprises a pressure chamber which houses said growth susceptor and the interior of which is maintained at a high pressure, said magnetic field applying means surrounding said pressure chamber.

4. An apparatus according to claim 3, wherein said magnetic field applying means includes a coil for applying a vertical magnetic field of 500 to 5,000 Gauss to the melt material in said crucible.

5. An apparatus according to claim 4, wherein said magnetic field applying means applies a vertical magnetic field of 1,000 to 3,000 Gauss to the melt material in said crucible by means of said coil.

6. An apparatus according to claim 3, wherein said pressure chamber is made of stainless steel and said main heating means includes a double spiral non-induction heater surrounding said growth chamber.

7. An apparatus according to claim 2, which further comprises a liquid stop plug fitted in said tubular portion of said crucible for separating the material in said crucible and the seed crystal in said tubular portion, and urging means for urging, when the material in said crucible is melted, seed crystal from below to project said liquid stop plug from said tubular portion, thereby bringing the melt material and the seed crystal into contact with each other.

8. An apparatus according to claim 7, wherein said crucible is adapted to store a material of Group III element of a two-component single crystal of compound semiconductors, and said gas material susceptor is adapted to store a material of Group V element.

9. An apparatus according to claim 7, wherein said crucible is adapted to store a material of a mixture, and said gas material susceptor is adapted to store a material of one type of element of the mixture.

10. An apparatus according to claim 1, wherein said main heating means includes a plurality of heating members that are temperature-controlled independently from each other and are aligned in the vertical direction.

11. An apparatus according to claim 1, which further comprises moving means for vertically moving said crucible and said main heating means relative to each other.

12. An apparatus according to claim 11, wherein said moving means includes a member for moving said main heating means in the vertical direction.

13. An apparatus for manufacturing a single crystal of compound semiconductor comprising at least two elements, comprising:
 a growth susceptor;
 a crucible for receiving and storing a first material containing at least one type of element and having a seed crystal arranged at a lower end portion thereof, said crucible being vertically movable relative to said growth susceptor;
 said crucible having an upper end open in said growth susceptor and a lower end with a small diameter tubular portion, the seed crystal being inserted in said tubular portion;
 a gas material susceptor, arranged below said crucible, for receiving and storing a material containing one type of element, said gas material susceptor and said crucible being arranged in said growth susceptor so as to be capable of communicating with each other, said gas material susceptor having an open upper end and being fixed to said growth susceptor;
 main heating means for heating and melting material in said crucible and for cooling the melt material from a lower portion thereof to grow a single crystal;
 a liquid stop plug fitted in said tubular portion of said crucible for separating the material in said crucible and the seed crystal in said tubular portion;
 urging means for urging, when material in said crucible is melted, the seed crystal from below to project said liquid stop plug from said tubular portion, thereby bringing the melt material and the seed crystal into contact with each other;
 sub heating means for heating and evaporating material in said gas material susceptor and for allowing the evaporated material to react with the melt material in said crucible; and
 magnetic field applying means for applying a vertical magnetic field in the melt material in said crucible so that a surface of the melt material in said crucible which is grown to a single crystal is lower in temperature at a central portion thereof than at a peripheral portion thereof in a radial direction and at the same time projects upward;
 said main heating means including control means for gradually decreasing the temperature of the heat applied to the melt material upward from a seed crystal, thereby growing a single crystal of compound semiconductor from the seed crystal.

14. An apparatus according to claim 13, which further comprises a protecting member covering a lower portion of the seed crystal and which is in direct contact with said push-up rod.

15. A method of manufacturing a single crystal of compound semiconductor comprising at least two elements, comprising the steps of:
 storing a first material including at least one type of element in a crucible provided in a growth susceptor and arranging a seed crystal at a lower end portion of said crucible;
 storing a material including one type of element in a gas material susceptor arranged under said crucible;
 heating the material in said crucible, for thereby melting the material;
 evaporating, by heating, the material in said gas material susceptor, thereby causing the material in said gas material susceptor to react with the melt material in said crucible;
 applying a vertical magnetic field to the melt material in said crucible such that a central portion of the melt material in said crucible is lower in temperature than a periphery thereof in the radial direction and such that the material projects upward; and
 gradually decreasing the temperature of heat applied to the melt material upward, from the seed crystal, thereby growing a compound semiconductor monocrystal from the seed crystal.

16. A method according to claim 15, wherein the step of storing the seed crystal in said crucible further comprises the step of inserting the seed crystal and a liquid stop plug having a smaller specific weight than the melt material into a small-diameter tubular portion projecting from a lower end of said crucible such that the crystal seed is located above the melt material; and the step of urging the seed crystal from below, after the material in said crucible is melted, to project said liquid stop plug from said tubular portion, thereby causing the melt material and the seed crystal to react with each other.

17. A method according to claim 16, wherein the element of the material stored in said crucible is different from the element of the material stored in said gas material susceptor.

* * * * *